(12) United States Patent
Kim et al.

(10) Patent No.: US 10,984,853 B2
(45) Date of Patent: Apr. 20, 2021

(54) X-RAY DETECTOR, SEMICONDUCTOR MEMORY DEVICE INCLUDING THE SAME, METHOD OF TESTING SEMICONDUCTOR MEMORY DEVICE AND METHOD OF MANUFACTURING SEMICONDUCTOR MEMORY DEVICE

(71) Applicant: SAMSUNG ELECTRONICS CO., LTD., Suwon-si (KR)

(72) Inventors: Ji-Woong Kim, Yongin-si (KR); Kyoung-Don Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 1 day.

(21) Appl. No.: 16/410,120

(22) Filed: May 13, 2019

(65) Prior Publication Data

US 2020/0105339 A1 Apr. 2, 2020

(30) Foreign Application Priority Data

Oct. 1, 2018 (KR) .......................... 10-2018-0116786

(51) Int. Cl.
*G11C 11/412* (2006.01)
*H01L 21/66* (2006.01)
*G11C 29/52* (2006.01)
*G01T 1/24* (2006.01)

(52) U.S. Cl.
CPC .......... *G11C 11/4125* (2013.01); *G01T 1/245* (2013.01); *G11C 29/52* (2013.01); *H01L 22/12* (2013.01)

(58) Field of Classification Search
CPC ..... G11C 11/4125; G11C 29/52; G01T 1/245; H01C 22/12
See application file for complete search history.

(56) References Cited

U.S. PATENT DOCUMENTS

| | | | | | |
|---|---|---|---|---|---|
| 4,234,928 | A | * | 11/1980 | Pfeifer | G05B 19/106 365/45 |
| 4,819,212 | A | * | 4/1989 | Nakai | G11C 8/12 365/185.04 |
| 4,860,260 | A | * | 8/1989 | Saito | G11C 29/24 365/201 |
| 4,924,487 | A | * | 5/1990 | Nishiki | A61B 6/487 378/190 |
| 5,117,113 | A | * | 5/1992 | Thomson | G01T 1/026 250/370.07 |
| 5,343,434 | A | * | 8/1994 | Noguchi | G11C 29/50 365/185.04 |
| 5,428,569 | A | * | 6/1995 | Kato | G11C 16/12 365/185.26 |

(Continued)

*Primary Examiner* — Blake C Riddick
(74) *Attorney, Agent, or Firm* — Lee IP Law, PC

(57) ABSTRACT

A semiconductor memory device includes a first data input/output (I/O) pad, an X-ray detector and a second data I/O pad. The first data I/O pad receives a test signal. The X-ray detector is connected to the first data I/O pad, includes a bipolar junction transistor (BJT) in which a voltage between an input end and an output end changes according to a cumulative X-ray dosage to the semiconductor memory device, and generates a test result signal indicating the voltage between the input and output ends of the BJT based on the test signal. The second data I/O pad is connected to the X-ray detector and outputs the test result signal.

18 Claims, 14 Drawing Sheets

(56) References Cited

U.S. PATENT DOCUMENTS

| | | | | |
|---|---|---|---|---|
| 5,568,426 A * | 10/1996 | Roohparvar | | G11C 16/3436 365/185.22 |
| 5,712,633 A * | 1/1998 | Bae | | H03M 1/109 341/120 |
| 6,380,729 B1 * | 4/2002 | Smith | | G01R 31/2884 257/209 |
| 7,057,180 B2 | 6/2006 | Fifield et al. | | |
| 7,220,968 B2 | 5/2007 | Burger et al. | | |
| 7,375,339 B2 | 5/2008 | Abadeer et al. | | |
| 8,890,083 B2 | 11/2014 | Paone et al. | | |
| 9,053,792 B2 | 6/2015 | Shin | | |
| 9,110,804 B2 | 8/2015 | Hannah | | |
| 9,672,880 B2 | 6/2017 | Buck et al. | | |
| 9,971,045 B2 | 5/2018 | Lu | | |
| 2005/0012045 A1 * | 1/2005 | Fifield | | G11C 11/4125 250/370.02 |
| 2005/0229050 A1 * | 10/2005 | Kanda | | G11C 29/46 714/718 |
| 2006/0186342 A1 * | 8/2006 | Burger | | G01T 1/17 250/370.01 |
| 2006/0242094 A1 * | 10/2006 | Tamakoshi | | H04L 67/12 706/23 |
| 2007/0252088 A1 * | 11/2007 | Abadeer | | G01T 1/244 250/370.07 |
| 2008/0169419 A1 * | 7/2008 | Petrick | | G01T 1/2018 250/370.09 |
| 2009/0080601 A1 * | 3/2009 | Tkaczyk | | G01T 1/24 378/19 |
| 2009/0189082 A1 * | 7/2009 | Stahmann | | A61N 1/37 250/370.07 |
| 2010/0008473 A1 * | 1/2010 | Liu | | G01T 7/00 378/189 |
| 2010/0108898 A1 * | 5/2010 | Zhang | | H04N 5/359 250/370.09 |
| 2011/0166449 A1 * | 7/2011 | Stahmann | | A61N 1/37 600/436 |
| 2013/0084660 A1 * | 4/2013 | Lu | | H01L 27/14689 438/14 |
| 2013/0151201 A1 * | 6/2013 | McCorkle | | G06F 17/141 702/189 |
| 2013/0264465 A1 * | 10/2013 | Dai | | H04N 5/378 250/208.1 |
| 2013/0313441 A1 * | 11/2013 | Paone | | G01T 1/247 250/394 |
| 2014/0138555 A1 * | 5/2014 | Hannah | | G06F 11/0793 250/394 |
| 2014/0205070 A1 * | 7/2014 | Caiafa | | H03K 17/04206 378/101 |
| 2015/0098262 A1 * | 4/2015 | Shin | | G11C 13/04 365/108 |
| 2015/0207415 A1 * | 7/2015 | Caiafa | | H05G 1/58 363/21.02 |
| 2015/0242143 A1 * | 8/2015 | Kim | | G11C 16/349 714/704 |
| 2015/0364216 A1 * | 12/2015 | Buck | | G11C 7/20 250/394 |
| 2016/0204782 A1 * | 7/2016 | Lee | | G11C 7/1096 365/189.17 |
| 2016/0357630 A1 * | 12/2016 | Kang | | G11C 29/52 |
| 2017/0184733 A1 * | 6/2017 | Lu | | G11C 29/52 |
| 2018/0052240 A1 | 2/2018 | Tanabe et al. | | |
| 2018/0083651 A1 * | 3/2018 | Song | | G11C 29/52 |
| 2019/0064373 A1 * | 2/2019 | Cao | | A61B 6/032 |

* cited by examiner

200

X-RAY DETECTOR, SEMICONDUCTOR MEMORY DEVICE INCLUDING THE SAME, METHOD OF TESTING SEMICONDUCTOR MEMORY DEVICE AND METHOD OF MANUFACTURING SEMICONDUCTOR MEMORY DEVICE

CROSS-REFERENCE TO RELATED APPLICATION

Korean Patent Application No. 10-2018-0116786, filed on Oct. 1, 2018 in the Korean Intellectual Property Office (KIPO), and entitled: "X-Ray Detector, Semiconductor Memory Device Including the Same, Method of Testing Semiconductor Memory Device and Method of Manufacturing Semiconductor Memory Device," is incorporated by reference herein in its entirety.

BACKGROUND

1. Field

Example embodiments relate generally to semiconductor devices and, more particularly, to X-ray detectors, semiconductor memory devices including the X-ray detectors, methods of testing the semiconductor memory devices and methods of manufacturing the semiconductor memory devices.

2. Description of the Related Art

Semiconductor memory devices store data in memory cells by performing a write operation and read the stored data by performing a read operation. Semiconductor memory devices can generally be divided into two categories depending upon whether or not they retain stored data when disconnected from a power supply. These categories include volatile memory devices, which lose stored data when disconnected from power, and nonvolatile memory devices, which retain stored data when disconnected from power. X-ray inspection has been performed to detect defects during manufacture and assembly of semiconductor memory devices. As semiconductor process technology continues to develop and wiring width and chip thickness have decreased, the damage of semiconductor memory devices by X-ray is increasing. However, quantifying the X-ray dosage is difficult.

SUMMARY

According to example embodiments, a semiconductor memory device includes a first data input/output (I/O) pad, an X-ray detector and a second data I/O pad. The first data I/O pad receives a test signal. The X-ray detector is connected to the first data I/O pad, includes a bipolar junction transistor (BJT) in which a voltage between an input end and an output end changes according to a cumulative X-ray dosage to the semiconductor memory device, and generates a test result signal indicating the voltage between the input and output ends of the BJT based on the test signal. The second data I/O pad is connected to the X-ray detector and outputs the test result signal.

According to example embodiments, an X-ray detector includes a current source, a bipolar junction transistor (BJT) and a voltage measurer. The current source is connected to a first data input/output (I/O) pad of a semiconductor memory device and generates a first current based on a test signal received from the first data I/O pad. The BJT is connected to the current source and includes an emitter electrode, a base electrode and a collector electrode to which the first current is applied. The voltage measurer is connected to the BJT and a second data I/O pad of the semiconductor memory device and generates a test result signal based on a voltage between the collector electrode and the emitter electrode of the BJT to output the test result signal through the second data I/O pad when the first current is applied to the collector electrode of the BJT. The voltage between the collector electrode and the emitter electrode of the BJT is changed according to a cumulative X-ray dosage to the semiconductor memory device.

According to example embodiments, in a method of testing a semiconductor memory device, a test signal is applied to a first data input/output (I/O) pad of the semiconductor memory device that includes the first data I/O pad, an X-ray detector connected to the first data I/O pad and including a bipolar junction transistor (BJT) in which a voltage between an input end and an output end changes according to a cumulative X-ray dosage to the semiconductor memory device and a second data I/O pad connected to the X-ray detector. Whether the semiconductor memory device is defective is determined based on a test result signal that is generated by the X-ray detector based on the test signal, indicates the voltage between the input and output ends of the BJT and is output through the second data I/O pad.

According to example embodiments, in a method of manufacturing a semiconductor memory device, the semiconductor memory device that includes a first data input/output (I/O) pad, an X-ray detector connected to the first data I/O pad and including a bipolar junction transistor (BJT) in which a voltage between an input end and an output end changes according to a cumulative X-ray dosage to the semiconductor memory device and a second data I/O pad connected to the X-ray detector is fabricated. The semiconductor memory device is tested based on the X-ray detector. When testing the semiconductor memory device, a test signal is applied to the first data I/O pad of the semiconductor memory device. Whether the semiconductor memory device is defective is determined based on a test result signal that is generated by the X-ray detector based on the test signal, indicates the voltage between the first and second ends of the BJT and is output through the second data I/O pad.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
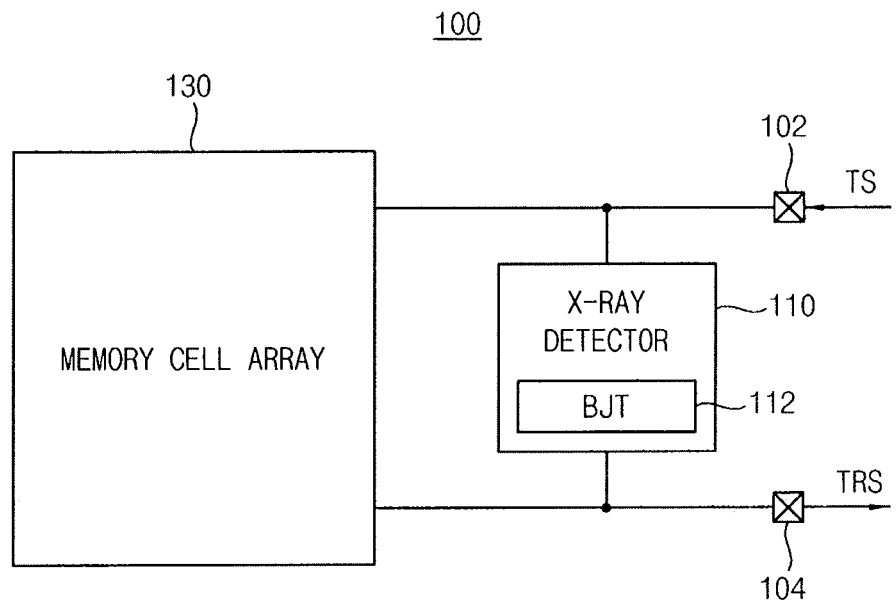
FIG. 1 illustrates a semiconductor memory device according to example embodiments.

Various example embodiments will be described more fully with reference to the accompanying drawings, in which embodiments are shown. The present disclosure may, however, be embodied in many different forms and should not be construed as limited to the embodiments set forth herein. Like reference numerals refer to like elements throughout this application.

FIG. 1 illustrates a semiconductor memory device according to example embodiments. Referring to FIG. 1, a semiconductor memory device 100 includes a first data input/output (I/O) pad 102, a second data I/O pad 104, an X-ray detector 110, and a memory cell array 130.

Figure 17:
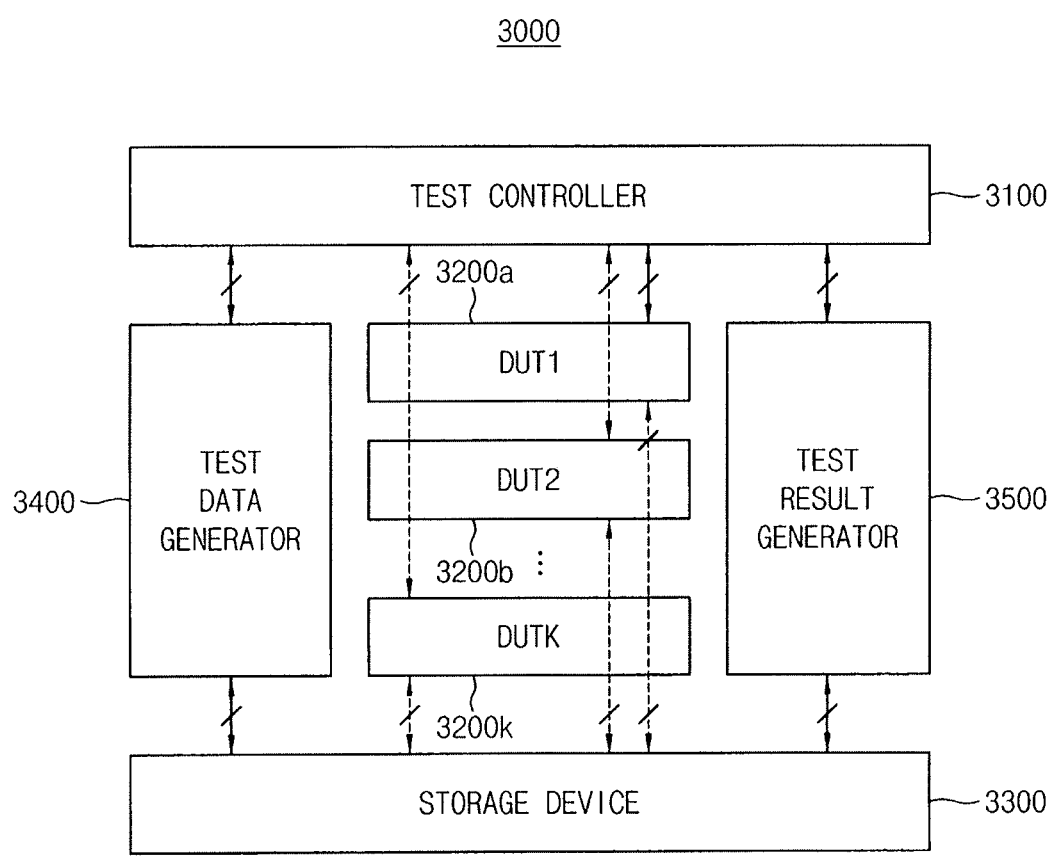
FIG. 17 illustrates a testing system that performs a method of testing a semiconductor memory device according to example embodiments.

The first data I/O pad 102 receives a test signal TS from an external test system (e.g., a test system 3000 of FIG. 17). The second data I/O pad 104 is separated and distinguished from the first data I/O pad 102, and outputs a test result signal TRS generated by the X-ray detector 110. The test result signal TRS may be provided to the external test system and may be used for determining whether the semiconductor memory device is defective or not. For example, the second I/O pad 104 may be a contact pad or a contact pin.

The X-ray detector (e.g., a device for measuring X-ray irradiation dosage) 110 is connected to the first data I/O pad 102 and the second data I/O pad 104. The X-ray detector 110 includes a bipolar junction transistor (BJT) 112. A voltage between both ends of the BJT 112, i.e., the input and output ends thereof, changes according to a cumulative X-ray dosage to the semiconductor memory device 100 (e.g., according to a total accumulated amount of X-ray incident on the semiconductor memory device 100). The X-ray detector 110 generates the test result signal TRS indicating the voltage between the both ends of the BJT 112 based on the test signal TS. Configurations and operations of the X-ray detector 110 will be described in detail with reference to FIG. 2.

The memory cell array 130 may also be connected to the first data I/O pad 102 and the second data I/O pad 104. The memory cell array 130 may include a plurality of memory cells for storing data. The memory cell array 130 may store data received from the first and second data I/O pads 102 and 104, or data stored in the memory cell array 130 may be output through the first and second data I/O pads 102 and 104.

In some example embodiments, each of the X-ray detector 110 and the memory cell array 130 may be enabled or disabled according to an operation mode of the semiconductor memory device 100, as will be described with reference to FIGS. 8A, 8B and 8C.

The semiconductor memory device 100 according to example embodiments may not include additional data I/O pads and/or signal I/O pads for the X-ray detector 110. In other words, the X-ray detector 110 in the semiconductor memory device 100 may receive the test signal TS and may output the test result signal TRS using the data I/O pads 102 and 104 that are connected to the memory cell array 130 to store and/or output data.

FIG. 1 illustrates that the X-ray detector 110 and the memory cell array 130 are directly connected to the data I/O pads 102 and 104, respectively. As another example, as will be described with reference to FIG. 11, at least one element and/or circuit for driving the semiconductor memory device 100 may be additionally provided between the memory cell array 130 and the data I/O pads 102 and 104. For another example, as will be described with reference to FIGS. 9 and 10, the X-ray detector 110 may be included in at least one element and/or circuit for driving the semiconductor memory device 100.

Figure 2:
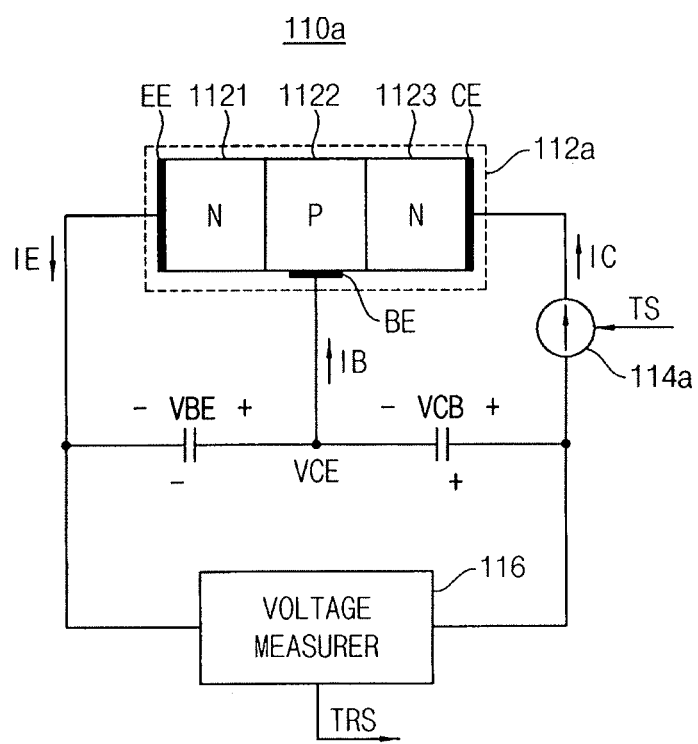
FIG. 2 illustrates an X-ray detector according to example embodiments.
Figure 3:
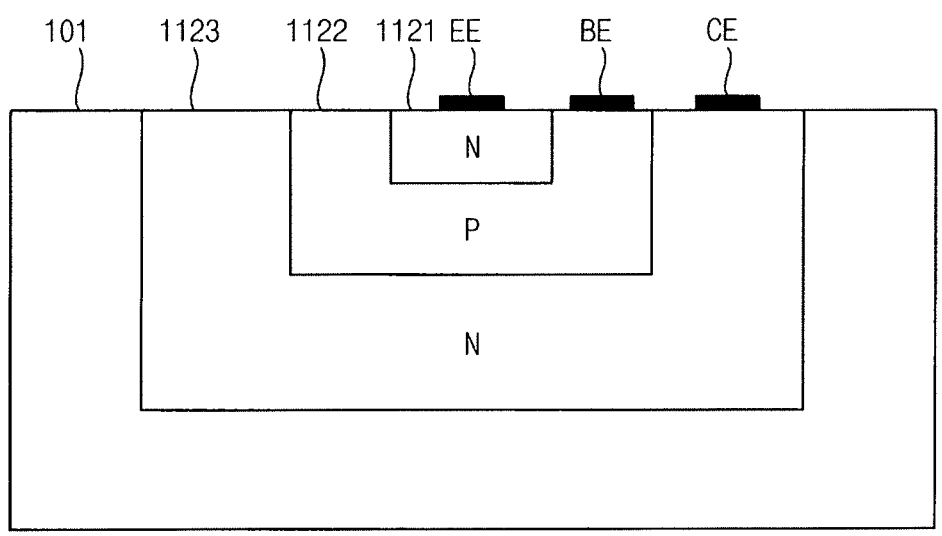
FIG. 3 illustrates a cross-sectional view of an example of a BJT included in the X-ray detector of FIG. 2.

FIG. 2 illustrates an X-ray detector according to example embodiments. FIG. 3 is a cross-sectional view of an example of a BJT included in the X-ray detector of FIG. 2. Referring to FIGS. 2 and 3, an X-ray detector 110a includes a BJT 112a, a current source 114a and a voltage measurer 116.

The BJT 112a includes an emitter electrode EE, a base electrode BE and a collector electrode CE. As described with reference to FIG. 1, a voltage between both ends of the BJT 112a changes according to the cumulative X-ray dosage incident on the semiconductor memory device 100. For example, the voltage between the both ends of the BJT 112a may be a voltage VCE between the collector electrode CE and the emitter electrode EE of the BJT 112a.

In some example embodiments, the BJT 112a may be an NPN (or an NPN-type) BJT. For example, the BJT 112a may further include a first N-type semiconductor region 1121, a P-type semiconductor region 1122, a second N-type semiconductor region 1123, a first junction, and a second junction. The first N-type semiconductor region 1121 may be connected to the emitter electrode EE. The P-type semiconductor region 1122 may be connected to the base electrode BE. The second N-type semiconductor region 1123 may be connected to the collector electrode CE. The first junction may be formed between the first N-type semiconductor region 1121 and the P-type semiconductor region 1122. The second junction may be formed between the P-type semiconductor region 1122 and the second N-type semiconductor region 1123.

As illustrated in FIG. 3, the BJT 112a may be formed in a semiconductor substrate 101. For example, the first N-type semiconductor region 1121 may be formed in the semiconductor substrate 101, the P-type semiconductor region 1122 may be formed in the semiconductor substrate 101 such that the first N-type semiconductor region 1121 is surrounded, e.g., on three sides, by the P-type semiconductor region 1122, and the second N-type semiconductor region 1123 may be formed in the semiconductor substrate 101 such that the P-type semiconductor region 1122 is surrounded, e.g., on three sides, by the second N-type semiconductor region 1123. The emitter electrode EE, the base electrode BE, and the collector electrode CE may be connected to the first N-type semiconductor region 1121, the P-type semiconductor region 1122, and the second N-type semiconductor region 1123, respectively. A cross-sectional structure of the BJT 112a may be changed according to example embodiments.

The current source 114a is connected to the first data I/O pad 102 of the semiconductor memory device 100 and receives the test signal TS from the first data I/O pad 102. The current source 114a generates a first current IC based on the test signal TS. For example, the first current IC may be applied to the collector electrode CE of the BJT 112a.

As the first current IC generated based on the test signal TS is applied to the collector electrode CE of the BJT 112a, a current IB and a current IE may flow in directions illustrated in FIG. 2 to the base electrode BE and from the emitter electrode EE, respectively. In addition, a voltage VCB may be between the collector electrode CE and the base electrode BE, a voltage VBE may be between the base electrode BE and the emitter electrode EE, and the voltage VCE may be between the collector electrode CE and the emitter electrode EE.

The voltage measurer 116 is connected to the BJT 112a and the second data I/O pad 104 of the semiconductor memory device 100. The voltage measurer 116 may generate the test result signal TRS based on the voltage between the both ends of the BJT 112a (e.g., the voltage VCE between the collector electrode CE and the emitter electrode EE of the BJT 112a) when the first current IC is applied to the collector electrode CE of the BJT 112a. The test result signal TRS may be output through the second data I/O pad 104.

In some example embodiments, a level of the first current IC generated from the current source 114a may be always fixed. As will be described with reference to FIGS. 4A, 4B, 4C, and 5, the voltage VCE between the collector electrode CE and the emitter electrode EE of the BJT 112a may increase as the cumulative X-ray dosage increases. Thus, the fixed first current IC (e.g., the first current IC having a constant level) may be applied to the collector electrode CE to determine whether the voltage VCE increases or not under the same conditions.

FIGS. 4A, 4B, 4C, and 5 are diagrams for describing an operation of an X-ray detector according to example embodiments.

Figure 4A:
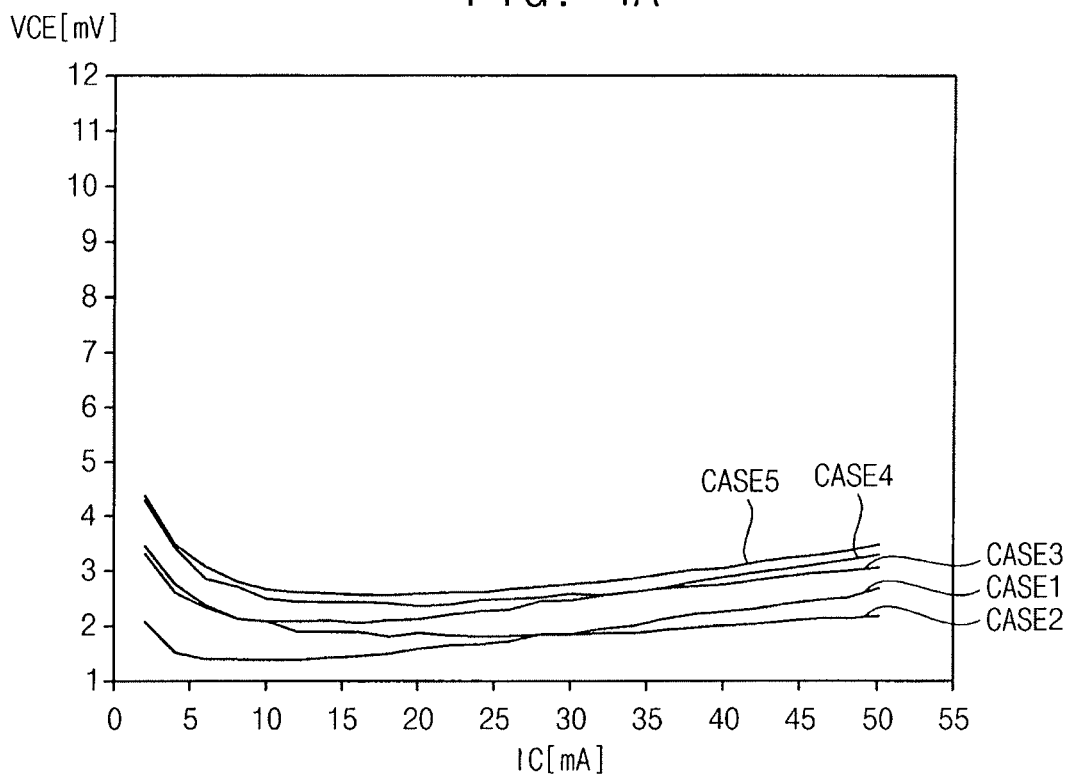
FIGS. 4A, 4B, 4C and 5 illustrate diagrams for describing an operation of an X-ray detector according to example embodiments.
Figure 4B:
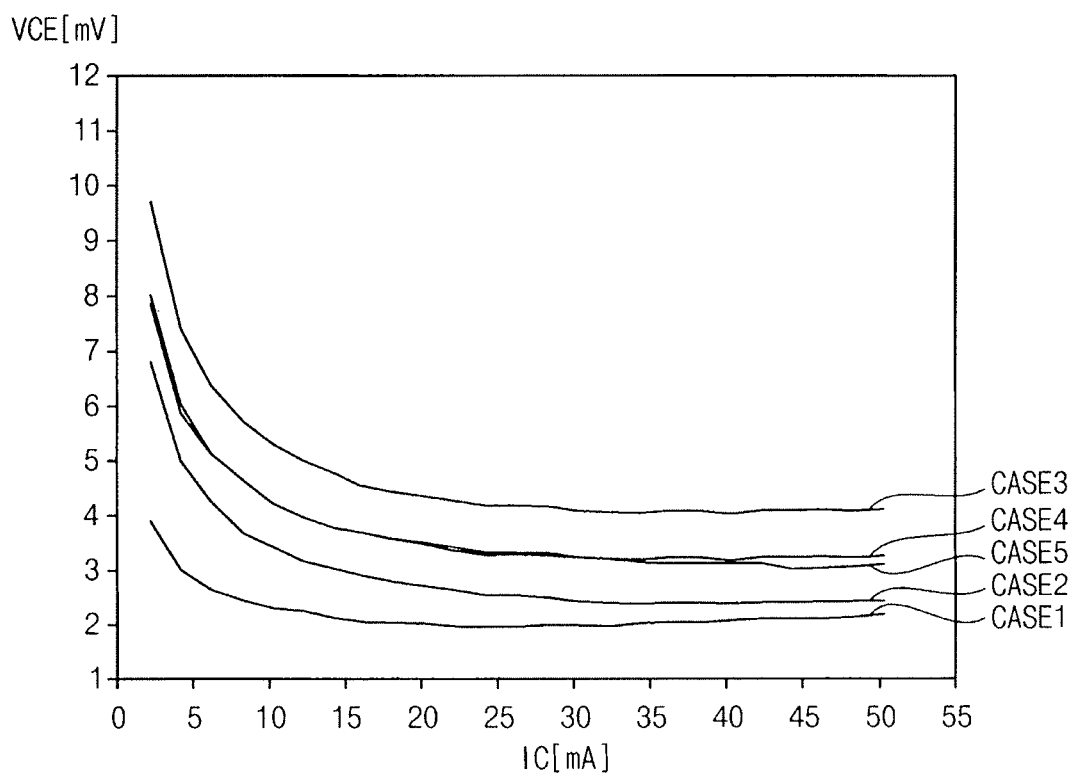
Figure 4C:
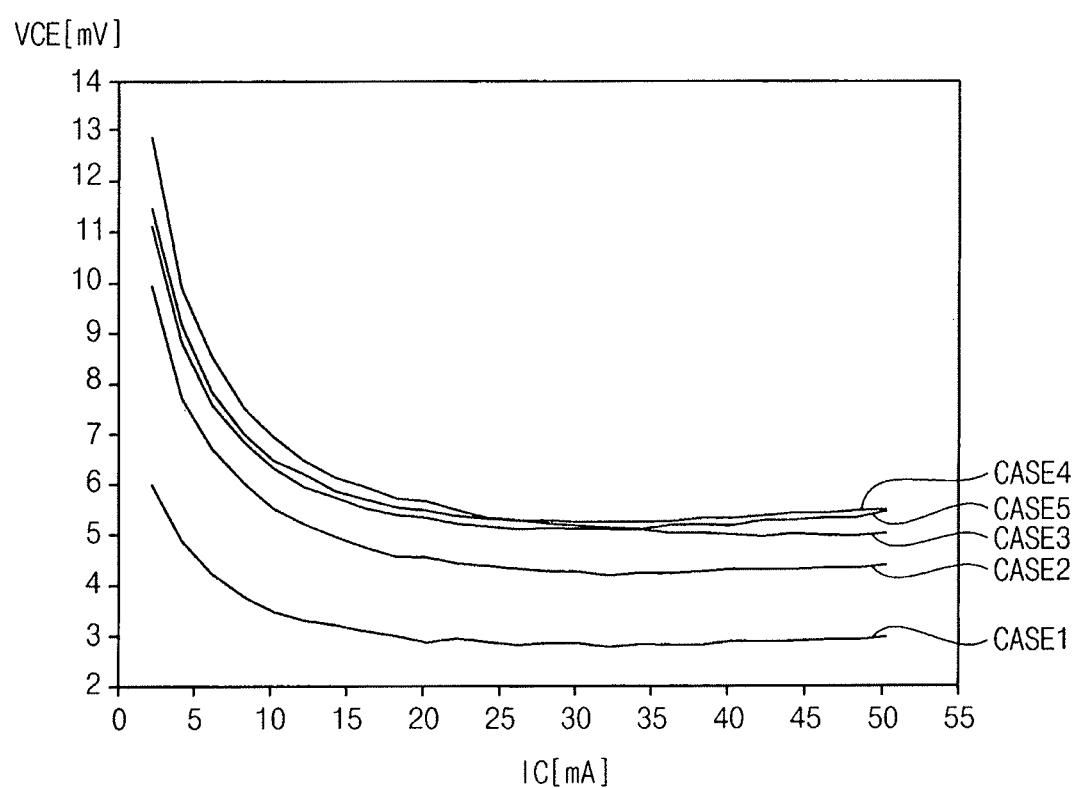

FIG. 4A is a graph illustrating a change of the voltage VCE in FIG. 2 according to the current IC in FIG. 2 when the cumulative X-ray dosage corresponds to a first time. FIG. 4B is a graph illustrating a change of the voltage VCE in FIG. 2 according to the current IC in FIG. 2 when the cumulative X-ray dosage corresponds to a second time longer than the first time. FIG. 4C is a graph illustrating a change of the voltage VCE in FIG. 2 according to the current IC in FIG. 2 when the cumulative X-ray dosage corresponds to a third time longer than the second time. For example, the first time may be about 180 seconds, the second time may be about 360 seconds, and the third time may be about 540 seconds, e.g., they may be evenly spaced such that the times linearly increase.

In addition, in FIGS. 4A, 4B, and 4C, CASE1 represents an example where X-ray is irradiated by a first amount, CASE2 represents an example where X-ray is irradiated by a second amount larger than the first amount, CASE3 represents an example where X-ray is irradiated by a third amount larger than the second amount. CASE4 represents an example where X-ray is irradiated by a fourth amount larger than the third amount, and CASE5 represents an example where X-ray is irradiated by a fifth amount larger than the fourth amount. For example, the first amount, the second amount, the third amount, the fourth amount and the fifth amount may be examples where a tube voltage of an X-ray generator is set to about 40 kVp, 60 kVp, 80 kVp, 100 kVp and 120 kVp, respectively, e.g., they may be evenly spaced such that the amounts linearly increase.

Referring to FIGS. 4A, 4B, and 4C, the voltage VCE between the collector electrode CE and the emitter electrode EE of the BJT 112a may increase as irradiation time of the X-ray (e.g., the cumulative X-ray dosage) increases, under the same conditions with respect to the current IC and the amount of the X-ray.

Figure 5:
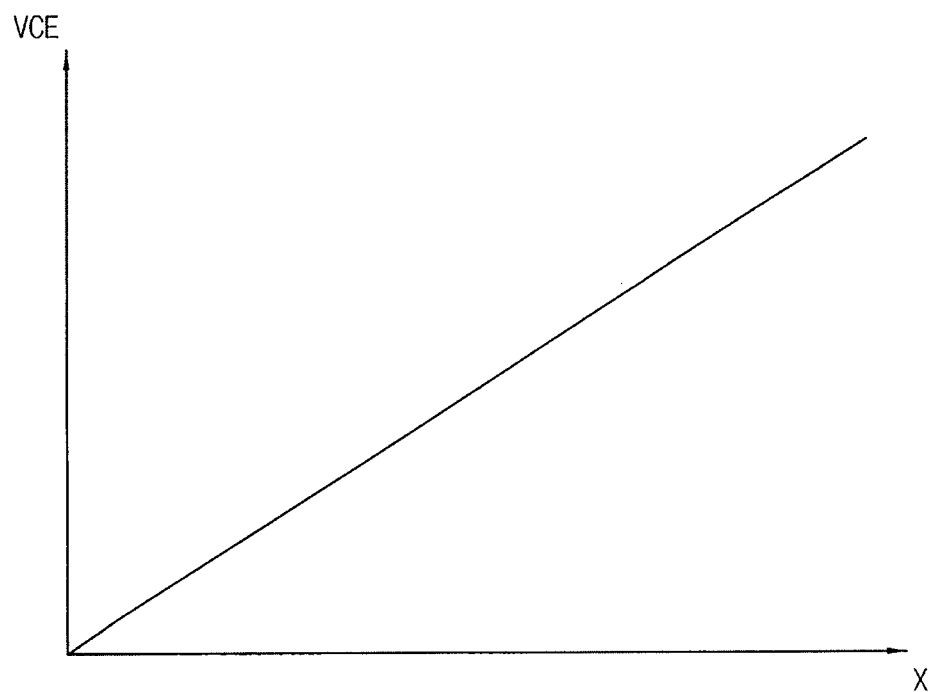

Referring to FIG. 5, the change of the voltage VCE according to a cumulative X-ray dosage X under the same conditions is illustrated based on graphs of FIGS. 4A, 4B, and 4C. FIG. 5 illustrates that the voltage VCE between the collector electrode CE and the emitter electrode EE of the BJT 112a increase e.g., linearly increases, as the cumulative X-ray dosage X increases.

Both a metal oxide semiconductor field effect transistor (MOSFET) and a BJT are types of transistors that are degraded or deteriorated when exposed to X-rays. For example, the MOSFET may have increased leakage current due to a change in a threshold voltage when exposed to X-rays and the BJT may have reduced current gain or increased VCE voltage when exposed to X-rays. The degraded characteristic of the MOSFET may be restored by radiation annealing, while the degraded characteristic of the BJT device may not.

As described with reference to FIGS. 4A, 4B, 4C, and 5, the voltage VCE between the collector electrode CE and the emitter electrode FE of the BJT 112a may increase as the cumulative X-ray dosage increases. In addition, the BJT may not recover the degraded or damaged characteristic by radiation annealing. The X-ray detector according to example embodiments may be implemented with the unrecoverable BJT. Thus, the cumulative X-ray dosage provided to the semiconductor memory device 100 may be efficiently quantified and monitored.

As described above, a current gain (e.g., β=IC/IB) of the BJT may decrease as the degraded characteristic of the BJT when exposed to X-rays and the current gain of the BJT may decrease as the cumulative X-ray dosage increases. Thus, in some example embodiments, the cumulative X-ray dosage to the semiconductor memory device 100 may be quantified and monitored based on the current gain of the BJT.

Figure 6:
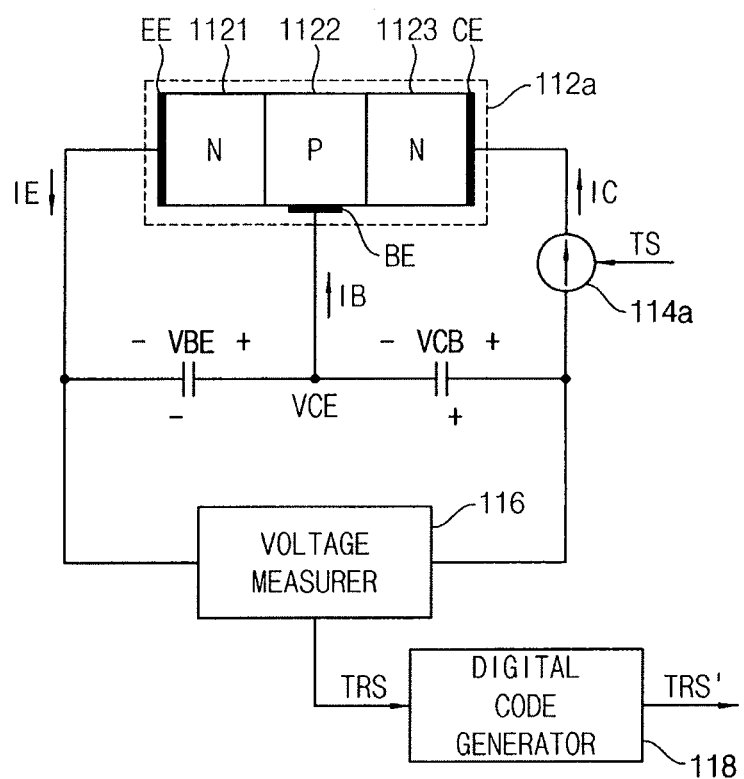
FIGS. 6 and 7 illustrate an X-ray detector according to example embodiments.
Figure 7:
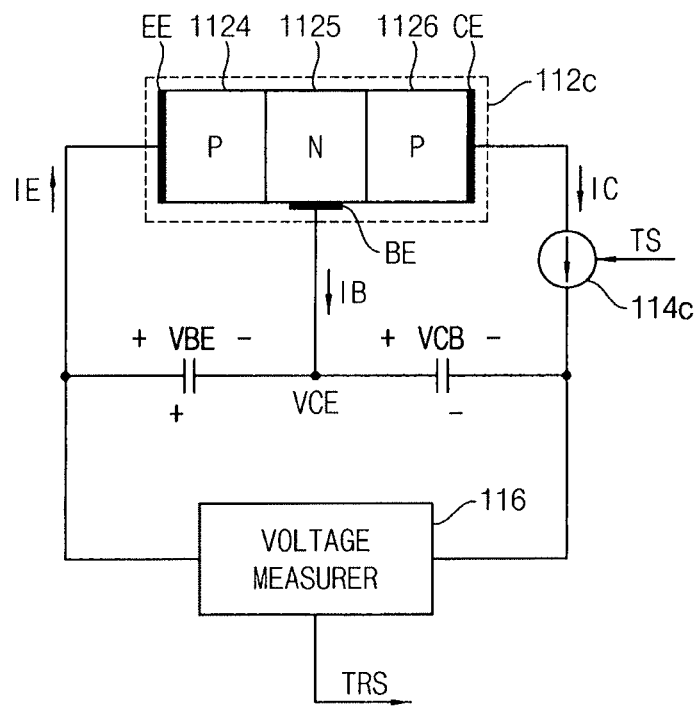

FIGS. 6 and 7 illustrate an X-ray detector according to example embodiments.

The descriptions repeated with FIG. 2 will be omitted.

Referring to FIG. 6, an X-ray detector 110b includes the BJT 112a, the current source 114a, and the voltage measurer 116. The X-ray detector 110b may further include a digital code generator 118.

The X-ray detector 110b of FIG. 6 may be substantially the same as the X-ray detector 110 of FIG. 2, except that the X-ray detector 110b further includes the digital code generator 118. The digital code generator 118 may be between the voltage measurer 116 and the second data I/O pad 104 of the semiconductor memory device 100 and may convert the test result signal TRS into a digital code to generate a digital test result signal TRS'. For example, the digital code generator 118 may include an analog-to-digital converter.

The X-ray detector 110b may convert the test result signal TRS into the digital code. Thus, the cumulative X-ray dosage to the semiconductor memory device 100 may be efficiently quantified and monitored.

Referring to FIG. 7, an X-ray detector 110c includes a BJT 112c, a current source 114c and the voltage measurer 116. The X-ray detector 110c of FIG. 7 may be substantially the same as the X-ray detector 110 of FIG. 2, except that configurations of the BJT 112c and the current source 114c in FIG. 7 are changed.

In some example embodiments, the BJT 112c may be a PNP (or a PNP-type) BJT. For example, the BJT 112c may further include a first P-type semiconductor region 1124, an N-type semiconductor region 1125, a second P-type semiconductor region 1126, a first junction, and a second junction. The first P-type semiconductor region 1124 may be connected to the emitter electrode EE. The N-type semiconductor region 1125 may be connected to the base electrode BE. The second P-type semiconductor region 1126 may be connected to the collector electrode CE. The first junction may be formed between the first P-type semiconductor region 1124 and the N-type semiconductor region 1125. The second junction may be formed between the N-type semiconductor region 1125 and the second P-type semiconductor region 1123.

As the BJT 112c is implemented as a PNP BJT, directions of the currents IC, IB, and IE, and polarities of the voltages VCB, VBE and VCE may be reversed to those illustrated in FIG. 2. The voltage VCE between the collector electrode CE and the emitter electrode EE of the BJT 112c may increase as the cumulative X-ray dosage increases. A cross-sectional structure of the BJT 112c may be similar to that illustrated in FIG. 3 or may be changed according to example embodiments.

The current source 114c generates the first current IC based on the test signal TS received from the first data I/O pad 102. As the BJT 112c is implemented as a PNP BJT, a current direction of the current source 114c is reversed to that illustrated in FIG. 2.

The current source 114c may be connected to the emitter electrode EE to generate the current IE according to example embodiments. The X-ray detector 110c of FIG. 7 may further include the digital code generator 118 illustrated in FIG. 6.

Figure 8A:
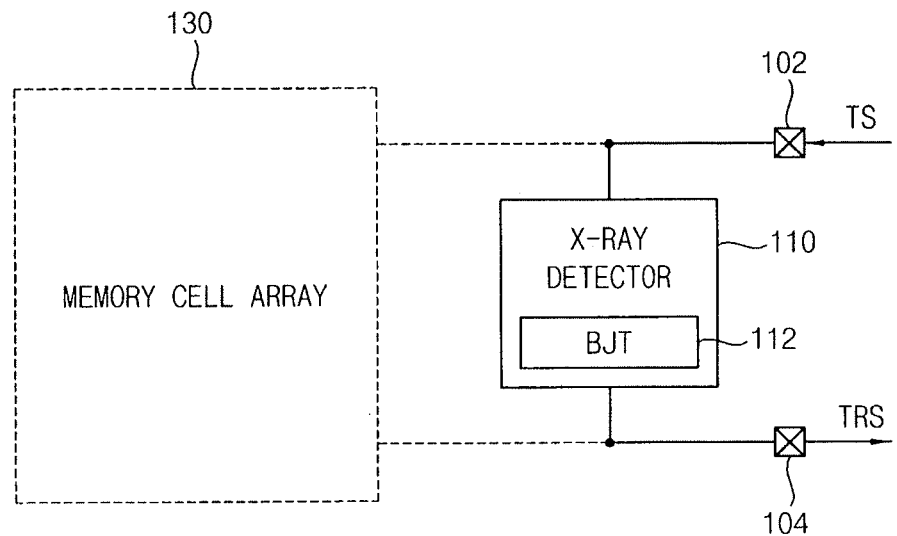
FIGS. 8A, 8B and 8C illustrate diagrams for describing an operation of a semiconductor memory device according to example embodiments.
Figure 8B:
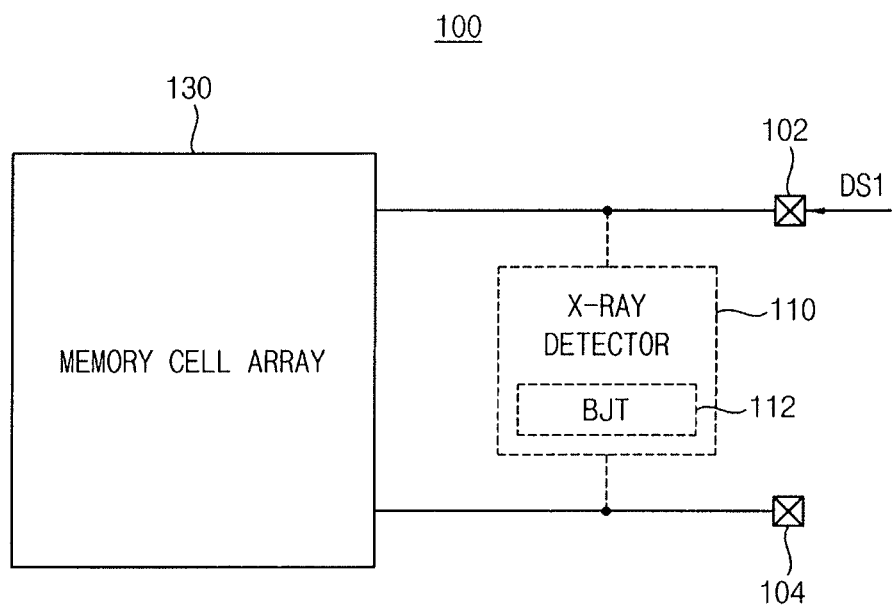
Figure 8C:
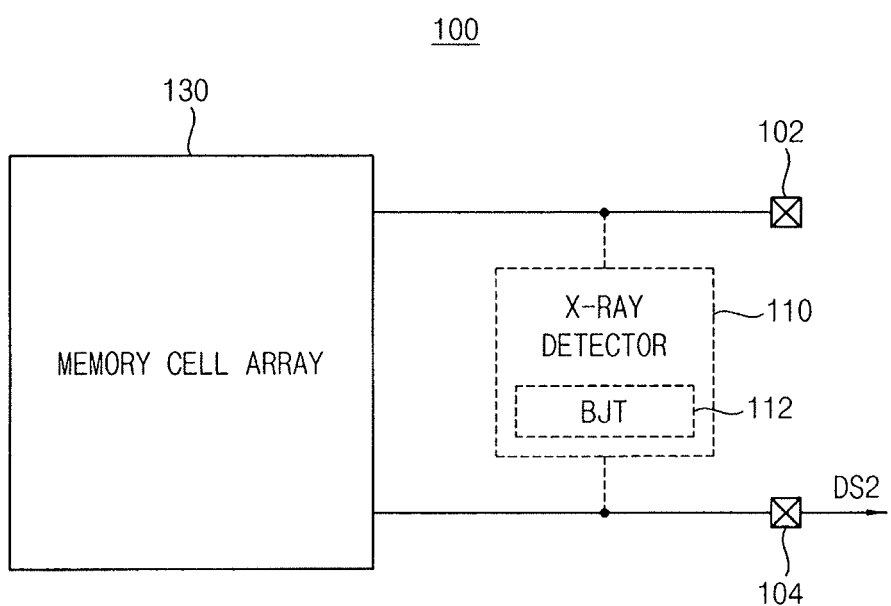

FIGS. 8A, 8B, and 8C are diagrams for describing an operation of a semiconductor memory device according to example embodiments. Referring to FIGS. 8A, 8B and 8C, the semiconductor memory device 100 may operate in one of a first operation mode and a second operation mode. The first operation mode may be referred to as a normal mode or a memory mode, and the second operation mode may be referred to as a test mode.

For example, as illustrated in FIG. 8A, the memory cell array 130 may be disabled and the X-ray detector 110 may be enabled during the second operation mode. The disabled memory cell array 130 and wirings connected thereto are illustrated by dotted lines in FIG. 8A. During the second operation mode, the X-ray detector 110 may generate the test result signal TRS based on the test signal TS received from the first data I/O pad 102 and may output the test result signal TRS through the second data I/O pad 104. For example, during the second operation mode, the semiconductor memory device 100 may be connected to the external test system (e.g., the test system 3000 of FIG. 17), may receive the test signal TS from the external test system, and may provide the test result signal TRS to the external test system.

In addition, as illustrated in FIGS. 8B and 8C, the memory cell array 130 may be enabled and the X-ray detector 110 may be disabled during the first operation mode. The disabled X-ray detector 110 and wirings connected thereto are illustrated by dotted lines in FIGS. 8B and 8C. During the first operation mode, the memory cell array 130 may store received data or output stored data using at least one of the first and second data I/O pads 102 and 104. For example, as illustrated in FIG. 8B, the memory cell array 130 may perform a data write operation to store first data based on a first data signal DS1 received from the first data I/O pad 102 during the first operation mode. For another example, as illustrated in FIG. 8C, the memory cell array 130 may perform a data read operation to output stored second data as a second data signal DS2 through the second data I/O pad 104 during the first operation mode.

In some example embodiments, one of the first operation mode and the second operation mode may be selected based on a command (e.g., a command CMD in FIG. 13) received from an external device (e.g., a memory controller 1210 in FIG. 13) located outside the semiconductor memory device 100.

Figure 9:
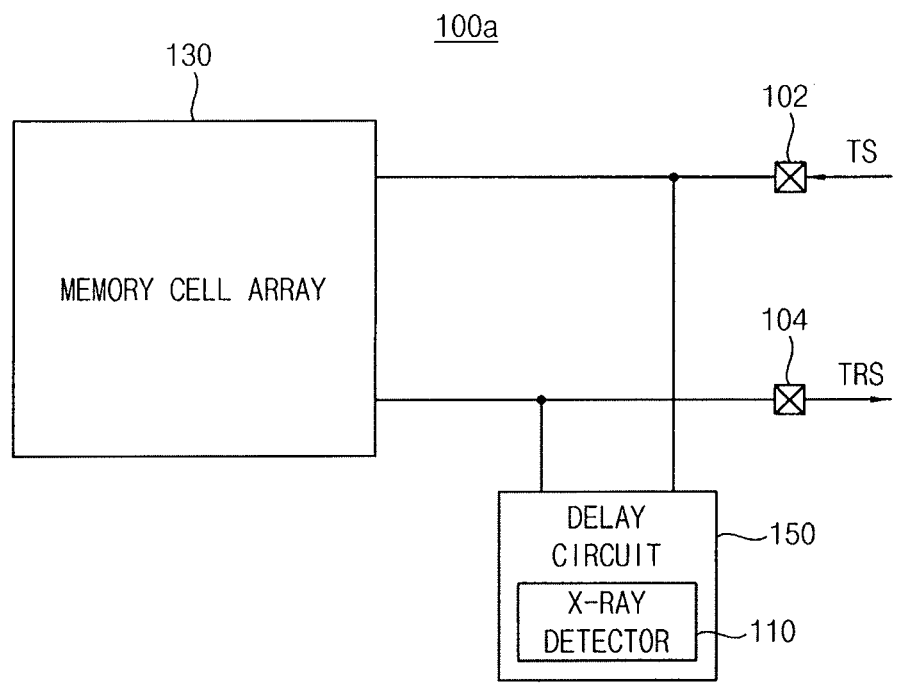
FIGS. 9 and 10 illustrate a semiconductor memory device according to example embodiments.
Figure 10:
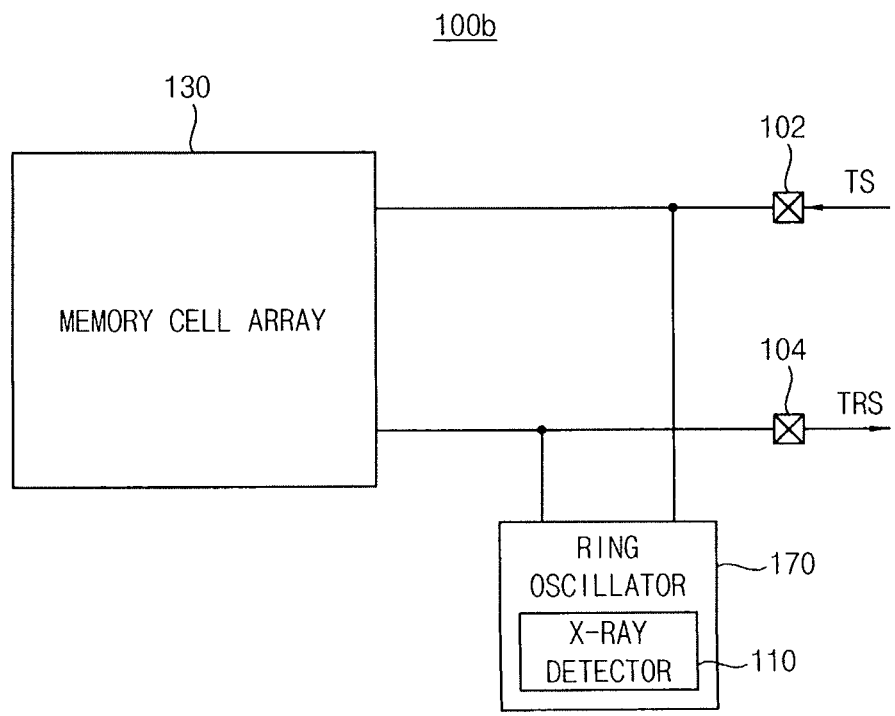

FIGS. 9 and 10 illustrate a semiconductor memory device according to example embodiments. The descriptions repeated with FIG. 1 will be omitted.

Referring to FIG. 9, a semiconductor memory device 100a includes the first data I/O pad 102, the second data I/O pad 104, the X-ray detector 110, and the memory cell array 130. The semiconductor memory device 100a may further include a delay circuit 150.

The semiconductor memory device 100a of FIG. 9 may be substantially the same as the semiconductor memory device 100 of FIG. 1, except that the semiconductor memory device 100a further includes the delay circuit 150. The delay circuit 150 may receive at least one signal to delay the at least one signal. For example, the delay circuit 150 may include a plurality of delay elements (e.g., inverters) connected in series to each other.

The X-ray detector 110 may be included, disposed, or mounted in the delay circuit 150. For example, the delay circuit 150 may be at least part of a propagation delay circuit that causes propagation delay in the semiconductor memory device 100a, and the X-ray detector 110 may be implemented by mounting a BJT in the propagation delay circuit.

Referring to FIG. 10, a semiconductor memory device 100b includes the first data I/O pad 102, the second data I/O pad 104, the X-ray detector 110, and the memory cell array 130. The semiconductor memory device 100b may further include a ring oscillator 170.

The semiconductor memory device 100b of FIG. 10 may be substantially the same as the semiconductor memory device 100 of FIG. 1, except that the semiconductor memory device 100b further includes the ring oscillator 170. The ring oscillator 170 may generate an oscillation signal that is used in the semiconductor memory device 100b. For example, the oscillation signal may be used as a clock signal or a reference signal in the semiconductor memory device 100b.

The X-ray detector 110 may be included, disposed, or mounted in the ring oscillator 170. For example, the X-ray detector 110 may be implemented using a BJT as a footer for the ring oscillator 170.

Examples where the X-ray detector 110 is included in the delay circuit 150 or the ring oscillator 170 are described with reference to FIGS. 9 and 10. As another example, for example, the X-ray detector 110 may be included in one of various elements included in the semiconductor memory device.

Examples where the semiconductor memory device includes a single first data I/O pad 102 and a single second data I/O pad 104 are described with reference to FIGS. 1 through 10. As another example, the number of data I/O pads (e.g., the first data I/O pad 102) receiving the test signal TS and the number of data I/O pads (e.g., the second data I/O pad 104) outputting the test result signal TRS may be changed according to example embodiments. In addition, examples where the first data I/O pad 102 receiving the test signal TS and the second data I/O pad 104 outputting the test result signal TRS are separated and distinguished from each other are described with reference to FIGS. 1 through 10. As another example, the receiving the test signal TS and the outputting the test result signal TRS may be performed by the same data I/O pads.

Examples where the semiconductor memory device includes a single X-ray detector 110 are described with reference to FIGS. 1 through 10. As another example, the semiconductor memory device may include two or more X-ray detectors. In cases where the semiconductor memory device includes two or more X-ray detectors, each X-ray detector may include one BJT and one current source, and one voltage measurer and one digital code generator may be shared by two or more X-ray detectors.

Figure 11:
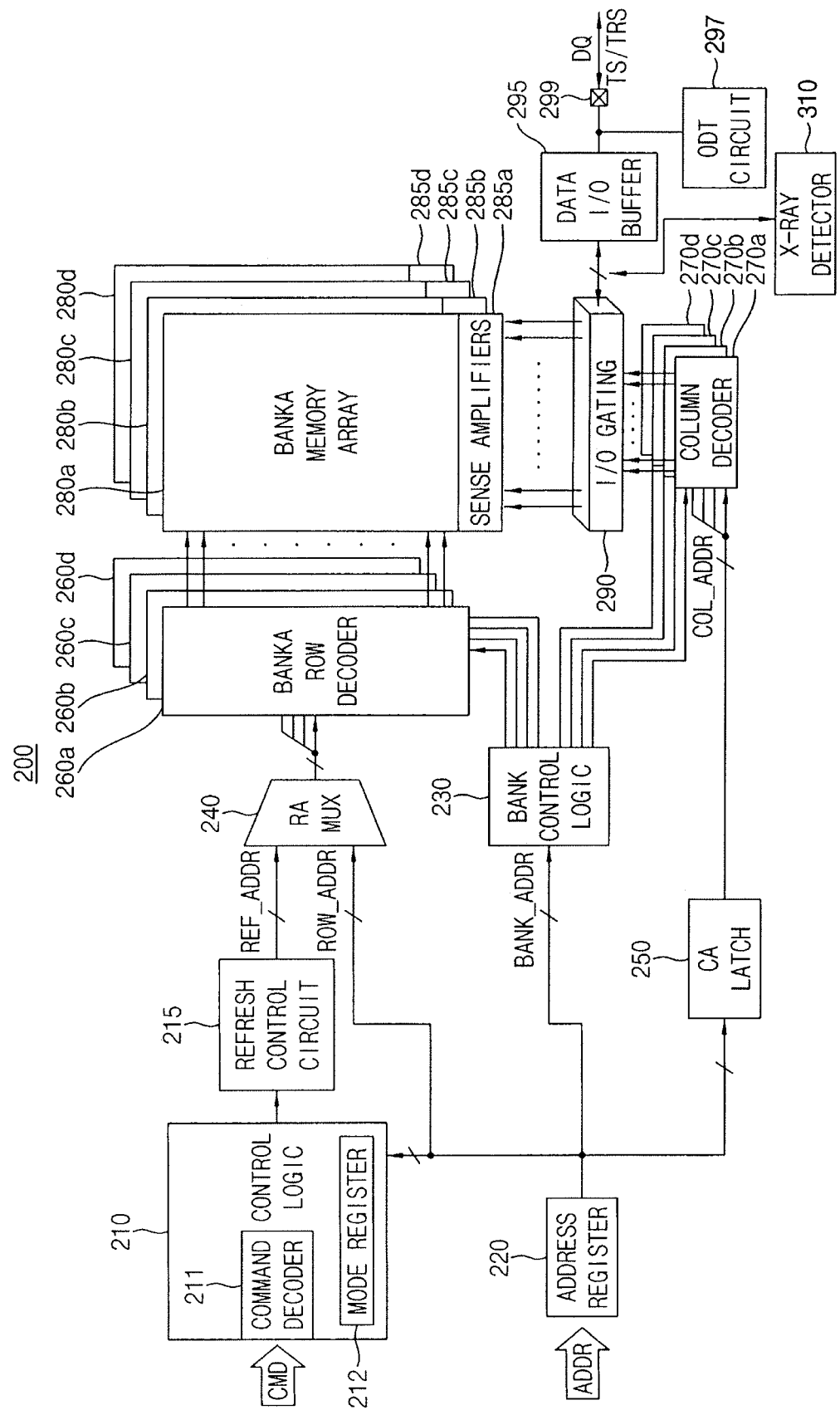
FIG. 11 illustrates of a semiconductor memory device according to example embodiments.

FIG. 11 is an example of a semiconductor memory device according to example embodiments. Referring to FIG. 11, a semiconductor memory device 200 includes a control logic circuit 210, a refresh control circuit 215, an address register 220, a bank control logic circuit 230, a row address multiplexer 240, a column address latch 250, a row decoder, a column decoder, a memory cell array, a sense amplifier unit (e.g., sense amplifier), an I/O gating circuit 290, a data I/O buffer 295, an on-die termination (ODT) circuit 297, a data I/O pad 299, and an X-ray detector 310. The specific combination and number of components may be varied.

In some example embodiments, the semiconductor memory device 200 may be a semiconductor memory device according to example embodiments, e.g., a volatile memory device. For example, the semiconductor memory device 200 may be one of various volatile memory devices such as a dynamic random access memory (DRAM), a mobile DRAM, a dual data rate (DDR) DRAM, a low power DDR (LPDDR) DRAM, a graphic DDR (GDDR) DRAM, or the like.

The memory cell array includes a plurality of memory cells. The memory cell array may include a plurality of bank arrays, e.g., first through fourth bank arrays 280a, 280b, 280c, and 280d. The row decoder may include a plurality of bank row decoders, e.g., first through fourth bank row decoders 260a, 260b, 260c, and 260d respectively connected to the first through fourth bank arrays 280a, 280b, 280c, and 280d. The column decoder may include a plurality of bank column decoders, e.g., first through fourth bank column decoders 270a, 270b, 270c, and 270d respectively connected to the first through fourth bank arrays 280a, 280b, 280c, and 280d. The sense amplifier unit may include a plurality of bank sense amplifiers, e.g., first through fourth bank sense amplifiers 285a, 285b, 285c, and 285d respectively connected to the first through fourth bank arrays 280a, 280b, 280c, and 280d.

The first through fourth bank arrays 280a-280d, the first through fourth bank row decoders 260a-260d, the first through fourth bank column decoders 270a-270d, and the first through fourth bank sense amplifiers 285a-285d may form first through fourth banks, respectively. For example, the first bank array 280a, the first bank row decoder 260a, the first bank column decoder 270a, and the first bank sense amplifier 285a may form the first bank; the second bank array 280b, the second bank row decoder 260b, the second bank column decoder 270b, and the second bank sense amplifier 285b may form the second bank; the third bank array 280c, the third bank row decoder 260c, the third bank column decoder 270c, and the third bank sense amplifier 285c may form the third bank; and the fourth bank array 280d, the fourth bank row decoder 260d, the fourth bank column decoder 270d, and the fourth bank sense amplifier 285d may form the fourth bank. Although FIG. 11 illustrates the semiconductor memory device 200 including four banks, the semiconductor memory device 200 may include any number of banks. Also, while the components in FIG. 11 are shown as having a one-to-one correspondence with each other, embodiments may include more or fewer decoders and/or sensor amplifiers than bank arrays.

Figure 13:
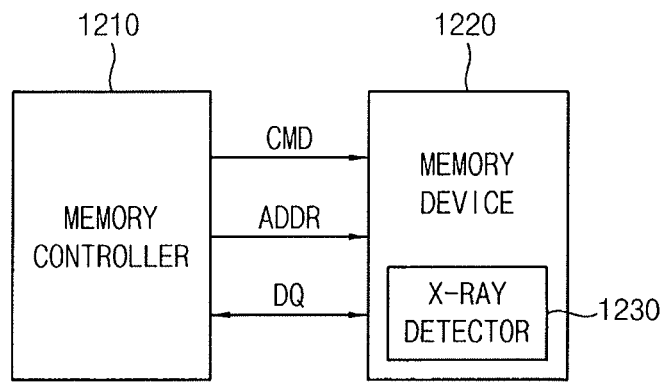
FIG. 13 illustrates a memory system including a semiconductor memory device according to example embodiments.

The address register 220 may receive an address ADDR including a bank address BANK_ADDR, a row address ROW_ADDR, and a column address COL_ADDR from a memory controller (e.g., the memory controller 1210 in FIG. 13). The address register 220 may provide the received bank address BANK_ADDR to the bank control logic circuit 230, may provide the received row address ROW_ADDR to the row address multiplexer 240, and may provide the received column address COL_ADDR to the column address latch 250.

The bank control logic circuit 230 may generate bank control signals in response to receipt of the bank address BANK_ADDR. One of the first through fourth bank row decoders 260a-260d corresponding to the received bank address BANK_ADDR may be activated in response to the bank control signals generated by the bank control logic circuit 230, and one of the first through fourth bank column decoders 270a-270d corresponding to the received bank address BANK_ADDR may be activated in response to the bank control signals generated by the bank control logic circuit 230.

The refresh control circuit 215 may generate a refresh address REF_ADDR in response to receipt of a refresh command or entrance of any self-refresh mode. For example, the refresh control circuit 215 may include a refresh counter that is configured to sequentially change the refresh address REF_ADDR from a first address of the memory cell array to a last address of the memory cell array, and a ring oscillator that generates an oscillation signal or a reference signal provided to the refresh counter. The refresh control circuit 215 may receive control signals from the control logic circuit 210.

The row address multiplexer 240 may receive the row address ROW_ADDR from the address register 220 and may receive the refresh address REF_ADDR from the refresh control circuit 215. The row address multiplexer 240 may selectively output the row address ROW_ADDR or the refresh address REF_ADDR. A row address output from the row address multiplexer 240 (e.g., the row address ROW_ADDR or the refresh address REF_ADDR) may be applied to the first through fourth bank row decoders 260a-260d.

The activated one of the first through fourth bank row decoders 260a-260d may decode the row address output from the row address multiplexer 240 and may activate a wordline corresponding to the row address. For example, the activated bank row decoder may apply a wordline driving voltage to the wordline corresponding to the row address.

The column address latch 250 may receive the column address COL_ADDR from the address register 220 and may temporarily store the received column address COL_ADDR. The column address latch 250 may apply the temporarily stored or received column address COL_ADDR to the first through fourth bank column decoders 270a-270d.

The activated one of the first through fourth bank column decoders 270a-270d may decode the column address COL_ADDR output from the column address latch 250 and may control the I/O gating circuit 290 to output data corresponding to the column address COL_ADDR. The I/O gating circuit 290 may include a circuitry for gating I/O data. For example, the I/O gating circuit 290 may include an input data mask logic, read data latches for storing data output from the first through fourth bank arrays 280a-280d, and write drivers for writing data to the first through fourth bank arrays 280a-280d.

Data DQ to be read from one of the first through fourth bank arrays 280a-280d may be sensed by a sense amplifier coupled to the corresponding bank array and may be stored in the read data latches. The data DQ stored in the read data latches may be provided to the memory controller via the data I/O buffer 295 and the data I/O pad 299. Data DQ received via the data I/O pad 299 that is to be written to one of the first through fourth bank arrays 280a-280d may be provided from the memory controller to the data I/O buffer 295. The data DQ received via the data I/O pad 299 and provided to the data I/O buffer 295 may be written to the corresponding bank array via the write drivers in the I/O gating circuit 290.

The control logic circuit 210 may control an operation of the semiconductor memory device 200. For example, the control logic circuit 210 may generate control signals for the semiconductor memory device 200 to perform a data write operation or a data read operation. The control logic circuit 210 may include a command decoder 211 that decodes a command CMD received from the memory controller and a mode register 212 that sets an operation mode of the semiconductor memory device 200. For example, the command decoder 211 may generate the control signals corresponding to the command CMD by decoding a write enable signal (e.g., /WE), a row address strobe signal (e.g., /RAS), a column address strobe signal (e.g., /CAS), a chip select signal (e.g., /CS), etc. The control logic circuit 210 may further receive a clock signal (e.g., CLK) and a clock enable signal (e.g., /CKE) for operating the semiconductor memory device 200 in a synchronous manner.

The ODT circuit 297 may be connected to the data I/O pad 299 and the data I/O buffer 295. When the ODT circuit 297 is enabled, an ODT operation may be performed. The ODT operation may reduce (and/or prevent) a signal from being reflected by using a termination resistor so as to improve signal integrity.

The X-ray detector 310 may be an X-ray detector according to example embodiments. For example, the X-ray detector 310 includes a BJT in which a voltage between both ends of the BJT changes (e.g., increases) according to a cumulative X-ray dosage to the semiconductor memory device 200. The X-ray detector 310 may be enabled in a test mode, may receive a test signal TS from the data I/O pad 299, and may generate a test result signal TRS indicating the voltage between the both ends of the BJT to output the test result signal TRS through the data I/O pad 299. The cumulative X-ray dosage to the semiconductor memory device 200 may be efficiently quantified and monitored using the X-ray detector 310. Thus, whether the semiconductor memory device 200 is defective or not may be readily determined.

In some example embodiments, when the X-ray detector 110 is included in the delay circuit 150 as described with reference to FIG. 9, the I/O gating circuit 290 and the data I/O buffer 295 in FIG. 11 may correspond to the delay circuit 150 in FIG. 9. Thus, the X-ray detector 310 may be included in at least one of the I/O gating circuit 290 and the data I/O buffer 295. In other example embodiments, when the X-ray detector 110 is included in the ring oscillator 170 as described with reference to FIG. 10, the ring oscillator included in the refresh control circuit 215 may correspond to the ring oscillator 170 in FIG. 10. Thus, the X-ray detector 310 may be included in the refresh control circuit 215.

Typically, elements of the semiconductor memory device 200 of FIG. 11 do not include a BJT, such that an additional BJT element is formed to implement the X-ray detector 310. As described with reference to FIG. 3, since a BJT has a simple structure including only doped regions and electrodes, the BJT may be formed using general processes for manufacturing the semiconductor memory device 200, i.e., without any additional process.

An example where the semiconductor memory device 200 is a volatile memory device is described with reference to FIG. 1. As another example, the semiconductor memory device according to example embodiment may be one of various nonvolatile memory devices, e.g., a flash memory, a phase change random access memory (PRAM), a resistance random access memory (RRAM), a nano floating gate memory (NFGM), a polymer random access memory (PoRAM), a magnetic random access memory (MRAM), a ferroelectric random access memory (FRAM), or the like.

Figure 12:
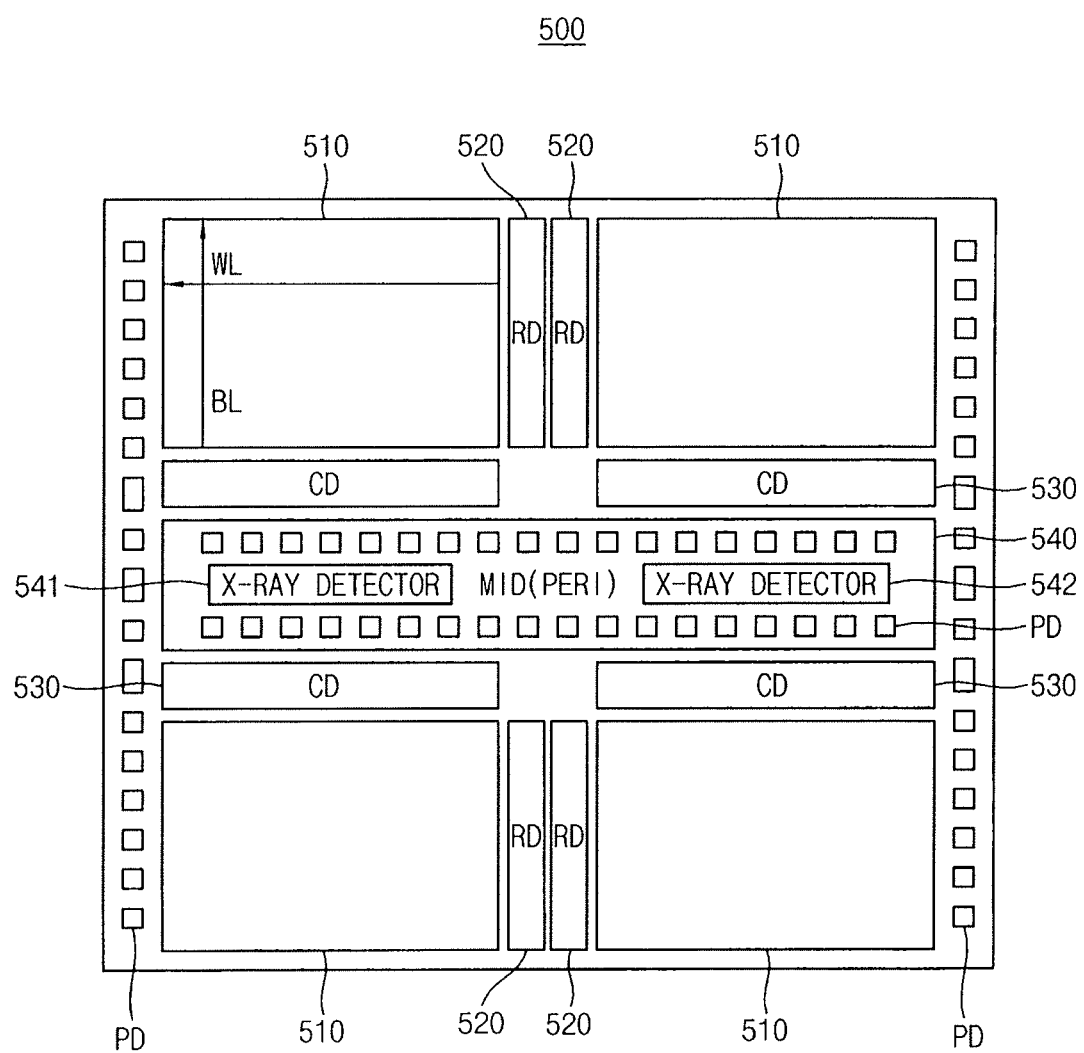
FIG. 12 illustrates a plan view of a layout of a semiconductor memory device according to example embodiments.

FIG. 12 is a plan view illustrating a layout of a semiconductor memory device according to example embodiments. Referring to FIG. 12, a semiconductor memory device 500 may include a plurality of bank arrays 510. Although FIG. 12 illustrates an example where the semiconductor memory device 500 includes four bank arrays 510, the number of bank arrays included in the semiconductor memory device may be changed according to example embodiments. Areas in which the bank arrays 510 are formed may be referred to as memory areas or core areas on a semiconductor substrate.

Row decoders 520 and column decoders 530 may be adjacent to the bank arrays 510, respectively. The row decoders 520 may be arranged in a wordline direction of the semiconductor memory device 500 and the column decoders 530 may be arranged in a bitline direction of the semiconductor memory device 500. Two row decoders allocated respectively to two adjacent bank arrays may be disposed adjacent to each other and may share a control line therebetween.

Pads PD may be in peripheral areas at edges and at a center of the semiconductor memory device 500, e.g., areas that surround the memory areas in which the bank arrays 510 are formed. The pads PD may be used to communicate with an external device (e.g., a host). In addition, X-ray detectors 541 and 542 may be in the peripheral area at the center of the semiconductor memory device 500. The row decoders 520, the column decoders 530, and the X-ray detectors 541 and 542 may constitute peripheral circuits. Pads PD may be between the X-ray detectors 541 and 542 and column decoders 530, and on opposite sides of the bank arrays 510 as the row decoders 520.

Although FIG. 12 illustrates example where the semiconductor memory device 500 includes two X-ray detectors 541 and 542, the number of X-ray detectors included in one semiconductor substrate or one semiconductor die may be changed according to example embodiments.

FIG. 13 illustrate a memory system including a semiconductor memory device according to example embodiments. Referring to FIG. 13, a memory system 1200 includes a memory controller 1210 and a semiconductor memory device 1220.

The memory controller 1210 may transmit a command signal CMD to the semiconductor memory device 1220 via a command transmission line, may transmit an address signal ADDR to the semiconductor memory device 1220 via an address transmission line, and may exchange data DQ with the semiconductor memory device 1220 via one or more data transmission lines. The memory controller 1210 may input data to the semiconductor memory device 1220 or may receive data output from the semiconductor memory device 1220 based on a request from a host.

The semiconductor memory device 1220 may be a semiconductor memory device according to example embodiments and may include an X-ray detector 1230. The X-ray detector 1230 may include a BJT in which a voltage between both ends of the BJT changes (e.g., increases) according to a cumulative X-ray dosage to the semiconductor memory device 1220. The cumulative X-ray dosage to the semiconductor memory device 1220 may be efficiently quantified and monitored using the X-ray detector 1230. Thus, whether the semiconductor memory device 1220 is defective or not may be efficiently determined.

Figure 14:
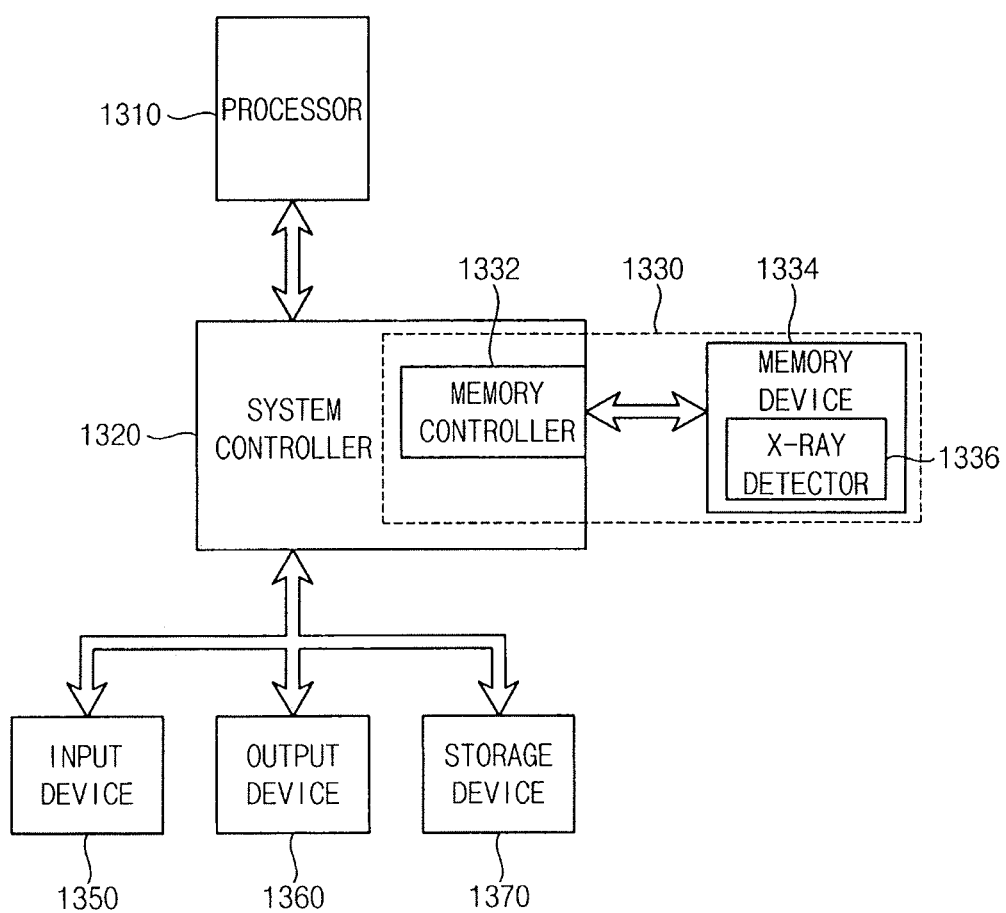
FIG. 14 illustrates a computing system including a semiconductor memory device according to example embodiments.

FIG. 14 illustrate a computing system including a semiconductor memory device according to example embodiments. Referring to FIG. 14, a computing system 1300 includes at least one processor 1310, a system controller 1320, and a memory system 1330. The computing system 1300 may further include an input device 1350, an output device 1360, and a storage device 1370.

The memory system 1330 includes at least one semiconductor memory device 1334 and a memory controller 1332 for controlling the semiconductor memory device 1334. The semiconductor memory device 1334 may be a semiconductor memory device according to example embodiments and may include an X-ray detector 1336. The memory controller 1332 may be included in the system controller 1320.

The processor 1310 includes hardware, e.g., integrated circuitry, to perform various computing functions, e.g., executing specific software instructions for performing specific calculations or tasks. The processor 1310 may be connected to the system controller 1320 via a processor bus. The system controller 1320 may be connected to the input device 1350, the output device 1360, and the storage device 1370 via an expansion bus. The controller may also include hardware, e.g., integrated circuitry. As such, the processor 1310 may control the input device 1350, the output device 1360, and the storage device 1370 using the system controller 1320.

Figure 15:
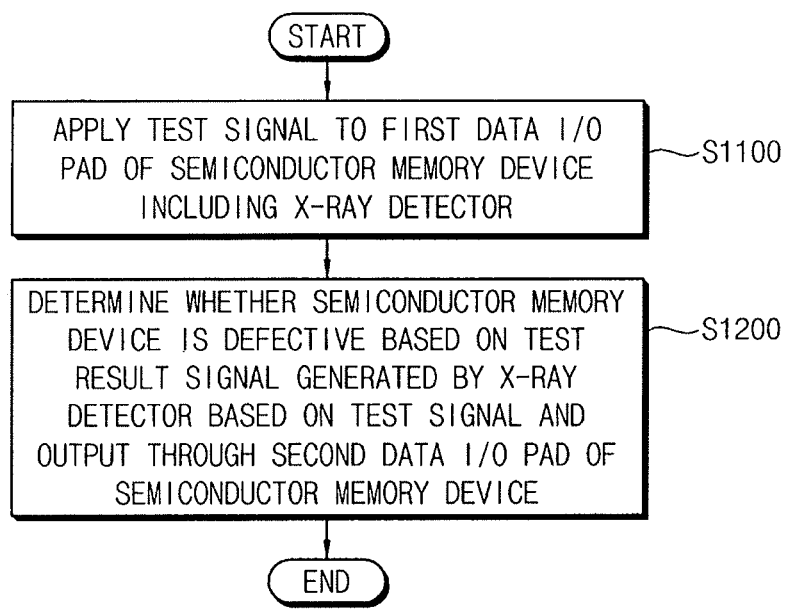
FIG. 15 illustrates a flowchart of a method of testing a semiconductor memory device according to example embodiments.

FIG. 15 is a flowchart illustrating a method of testing a semiconductor memory device according to example embodiments.

Referring to FIG. 15, in a method of testing a semiconductor memory device including an X-ray detector according to example embodiments, a test signal is applied to a first data I/O pad of the semiconductor memory device (operation S1100). For example, the X-ray detector includes a BJT in which a voltage between both ends changes (e.g., increases) according to a cumulative X-ray dosage to the semiconductor memory device Whether the semiconductor memory device is defective or not is determined in accordance with a test result signal generated by the X-ray detector based on the test signal and the test result signal output through the second data I/O pad of the semiconductor memory device (operation S1200). For example, the test result signal indicates the voltage between both ends of the BJT.

Configurations of the semiconductor memory device and the X-ray detector included therein may be substantially the same as those described with reference to FIGS. 1 through 14. The cumulative X-ray dosage to the semiconductor memory device may be efficiently quantified and monitored using the X-ray detector. Thus, whether the semiconductor memory device is defective or not may be efficiently determined.

Figure 16:
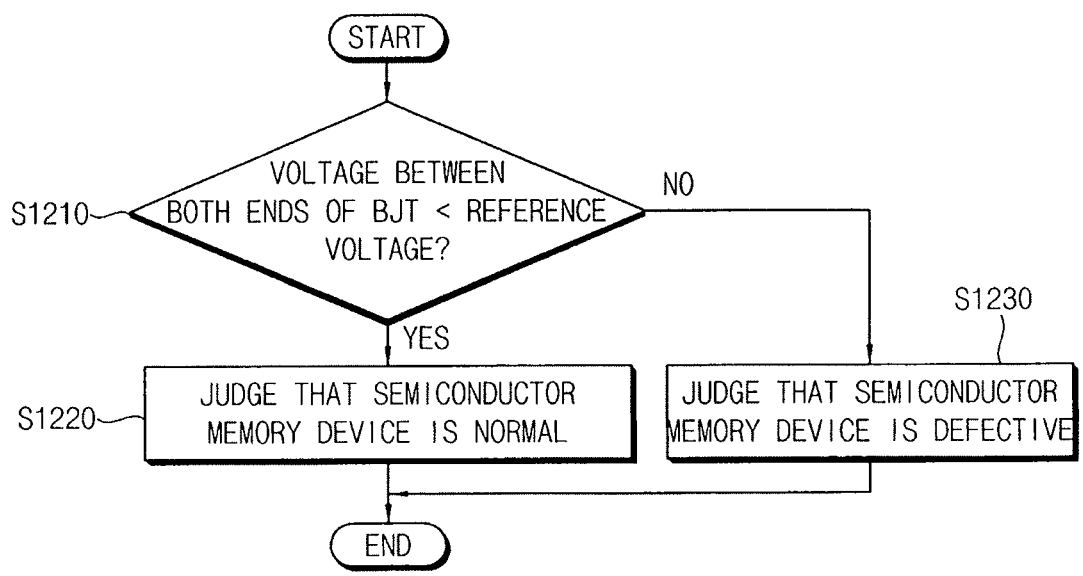
FIG. 16 illustrates a flowchart of an example of determining whether the semiconductor memory device is defective in FIG. 15.

FIG. 16 is a flowchart illustrating an example of determining whether the semiconductor memory device is defective in operation S1200 of FIG. 15.

Referring to FIGS. 15 and 16, when the test result signal indicates that the voltage between the both ends of the BJT is lower than a reference voltage (operation S1210: YES), the semiconductor memory device may be determined to be normal (operation S1220). In other words, when the voltage at the both ends of the BJT element is lower than the reference voltage, the cumulative X-ray dosage is less than a reference value. Thus, the semiconductor memory device may be judged to be normal.

When the test result signal indicates that the voltage between the both ends of the BJT is higher than or equal to the reference voltage (operation S1210: NO), the semiconductor memory device may be determined to be defective (operation S1230). In other words, when the voltage at the both ends, i.e., the input and output ends, of the BJT element is higher than or equal to the reference voltage, the cumulative X-ray dosage is greater than or equal to the reference value. In cases where the cumulative X-ray dosage is greater than or equal to the reference value, the semiconductor memory device may not have a normal state due to a deterioration of refresh characteristic of the volatile memory device, a wiring failure (e.g., a neck broken) at the time of assembly, or the like. Thus, the semiconductor memory device may be judged to be defective.

In some example embodiments, when the cumulative X-ray dosage to the semiconductor memory device is quantified and monitored based on the current gain of the BJT, the semiconductor memory device may be judged as normal when the current gain is higher than a reference gain and may be judged as defective when the current gain is lower than or equal to the reference gain.

FIG. 17 illustrates a test system that performs a method of testing a semiconductor memory device according to example embodiments. Referring to FIG. 17, a test system 3000 may include a test controller 3100, a plurality of devices under test (DUTs) 3200a, 3200b, . . . , 3200k, a storage device 3300, a test data generator 3400, and a test result generator 3500. Each of the plurality of DUTs 3200a-3200k may be a semiconductor memory device according to example embodiments and may include an X-ray detector according to example embodiments.

The test controller 3100 may control a test for each of the plurality of DUTs 3200a-3200k by controlling elements included in the test system 3000. The storage device 3300 may store data for the test. The test data generator 3400 may generate a test signal TS to provide the test signal TS to the plurality of DUTs 3200a-3200k. The test result generator 3500 may receive a test result signal TRS from the plurality of DUTs 3200a-3200k to determine whether each of the plurality of DUTs 3200a-3200k is defective or not. In other words, operation S1100 in FIG. 15 may be performed by the test data generator 3400, and operation S1200 in FIG. 15 may be performed by the test result generator 3500.

Figure 18:
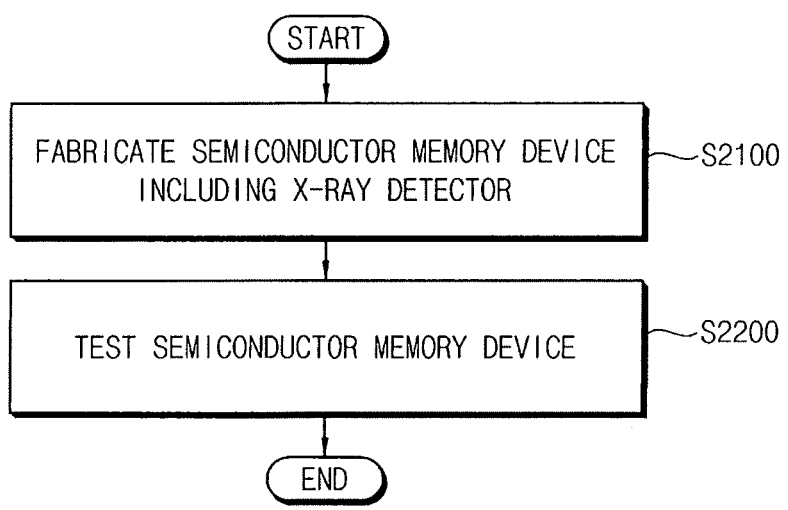
FIG. 18 illustrates a flowchart of a method of manufacturing a semiconductor memory device according to example embodiments.

FIG. 18 is a flowchart illustrating a method of manufacturing a semiconductor memory device according to example embodiments.

Referring to FIG. 18 in a method of manufacturing a semiconductor memory device according to example embodiments, the semiconductor memory device including an X-ray detector may be fabricated (operation S2100). For example, the X-ray detector includes a BJT in which a voltage between both ends changes (e.g., increases) according to a cumulative X-ray dosage to the semiconductor memory device.

The semiconductor memory device is tested (operation S2200). For example, operation S2200 in FIG. 18 may be performed based on the method of testing the semiconductor memory device described with reference to FIG. 15. The damage or defect of the semiconductor memory device due to X-ray inspection may be detected in real time and, thus, the manufacturing efficiency may be improved.

The method of manufacturing the semiconductor memory device using the method of testing the semiconductor memory device is described with reference to FIG. 18. As another example, when the manufacture of the semiconductor memory device is completed and before the product is shipped and delivered to a customer, the manufactured semiconductor memory device may be tested based on the method of testing the semiconductor memory device according to example embodiments to generate a first test result, and the first test result for the semiconductor memory device may be stored. After that, when the semiconductor memory device which has been shipped is returned as a defective product, the returned semiconductor memory device may be additionally tested based on the method of testing the semiconductor memory device according to example embodiments to generate a second test result, and thus it may be determined by comparing the first test result with the second test result whether the damage or defect of the semiconductor memory device occurs before or after the shipment.

At least one example embodiment provides a semiconductor memory device including an X-ray detector capable of quantifying and monitoring an X-ray dosage. At least one example embodiment provides an X-ray detector capable of quantifying and monitoring an X-ray dosage. At least one example embodiment of provides a method of testing and manufacturing the semiconductor memory device including the X-ray detector.

The X-ray detector according to example embodiments may be implemented with a BJT. Characteristics of the BJT may be degraded or deteriorated when X-ray is irradiated. For example, the BJT may have reduced current gain or increased VCE voltage when the X-ray is irradiated. In addition, the degraded characteristic of the BJT device may not be restored by the radiation annealing. Thus, the cumulative X-ray dosage to the semiconductor memory device may be efficiently quantified and monitored.

In the semiconductor memory device, the method of testing the semiconductor memory device and the method of manufacturing the semiconductor memory device according to example embodiments, the semiconductor memory device may include the X-ray detector implemented with the BJT. Thus, whether the semiconductor memory device is defective or not may be determined.

Embodiments may be applied to various electronic devices and electronic systems including the semiconductor memory device. For example, embodiments may be applied to systems such as a mobile phone, a smart phone, a tablet computer, a laptop computer, a personal digital assistant (PDA), a portable multimedia player (PMP), a digital camera, a portable game console, a music player, a camcorder, a video player, a navigation device, a wearable device, an internet of things (IoT) device, an internet of everything (IoE) device, an e-book reader, a virtual reality (VR) device, an augmented reality (AR) device, a robotic device, etc.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor memory device, comprising:
    a semiconductor substrate that includes a memory area in which a memory cell array is formed;
    a first data input/output (I/O) pad to receive a test signal;
    an X-ray detector connected to the first data I/O pad, the X-ray detector including a bipolar junction transistor (BJT) formed in the semiconductor substrate and having a voltage between an input end and an output end that changes according to a cumulative X-ray dosage to the semiconductor memory device, the X-ray detector to generate a test result signal indicating the voltage between the input and output ends of the BJT based on the test signal; and
    a second data I/O pad connected to the X-ray detector and to output the test result signal, wherein:
    the BJT includes N-type and P-type semiconductor regions formed in the semiconductor substrate.

2. The semiconductor memory device as claimed in claim 1, wherein the BJT is an NPN BJT that includes:
    a first N-type semiconductor region in the semiconductor substrate and connected to an emitter electrode;
    a P-type semiconductor region in the semiconductor substrate and connected to a base electrode;
    a second N-type semiconductor region in the semiconductor substrate and connected to a collector electrode;
    a first junction between the first N-type semiconductor region and the P-type semiconductor region; and
    a second junction between the P-type semiconductor region and the second N-type semiconductor region.

3. The semiconductor memory device as claimed in claim 2, wherein the voltage between the input and output ends of the BJT increases as the cumulative X-ray dosage increases.

4. The semiconductor memory device as claimed in claim 3, wherein the voltage between the input and output ends of the BJT is a voltage between the collector electrode and the emitter electrode of the NPN BJT.

5. The semiconductor memory device as claimed in claim 1, wherein the BJT is a PNP BJT that includes:
    a first P-type semiconductor region in the semiconductor substrate and connected to an emitter electrode;
    an N-type semiconductor region in the semiconductor substrate and connected to a base electrode;
    a second P-type semiconductor region in the semiconductor substrate and connected to a collector electrode;
    a first junction between the first P-type semiconductor region and the N-type semiconductor region; and
    a second junction between the N-type semiconductor region and the second P-type semiconductor region.

6. The semiconductor memory device as claimed in claim 1, wherein the X-ray detector further includes:
    a current source to generate a first current applied to a collector electrode of the BJT based on the test signal; and a voltage measurer to generate the test result signal based on a voltage between the collector electrode and an emitter electrode of the BJT when the first current is applied to the collector electrode of the BJT.

7. The semiconductor memory device as claimed in claim 6, wherein a level of the first current generated from the current source is fixed.

8. The semiconductor memory device as claimed in claim 6, further comprising a digital code generator between the voltage measurer and the second data I/O pad, the digital code generator to convert the test result signal into a digital code.

9. The semiconductor memory device as claimed in claim 1, wherein the memory cell array is connected to the first data I/O pad and the second data I/O pad, the memory cell array including a plurality of memory cells.

10. The semiconductor memory device as claimed in claim 9, wherein:
the memory cell array is to store first data based on a first data signal received from at least one of the first and second data I/O pads or to output stored second data as a second data signal through the at least one of the first and second data I/O pads during a first operation mode, and
the X-ray detector is to generate the test result signal based on the test signal received from the first data I/O pad and to output the test result signal through the second data I/O pad during a second operation mode.

11. The semiconductor memory device as claimed in claim 10, wherein:
the memory cell array is disabled during the second operation mode, and
the X-ray detector is disabled during the first operation mode.

12. The semiconductor memory device as claimed in claim 10, wherein one of the first operation mode and the second operation mode is selected based on a command received from an external device.

13. The semiconductor memory device as claimed in claim 9, wherein the X-ray detector is in a peripheral area surrounding the memory area on the semiconductor substrate.

14. The semiconductor memory device as claimed in claim 1, further comprising a delay circuit to receive at least one signal and to delay the at least one signal, wherein the X-ray detector is included in the delay circuit.

15. The semiconductor memory device as claimed in claim 1, further comprising:
a ring oscillator to generate an oscillation signal, and
wherein the X-ray detector is included in the ring oscillator.

16. The semiconductor memory device as claimed in claim 1, wherein the semiconductor memory device is a dynamic random access memory (DRAM).

17. An X-ray detector, comprising:
a semiconductor substrate;
a current source connected to a first data input/output (I/O) pad on the semiconductor substrate, the first I/O pad being connected to a semiconductor memory device, the current source to generate a first current based on a test signal received from the first data I/O pad;
a bipolar junction transistor (BJT) formed in the semiconductor substrate and connected to the current source, the BJT including an emitter electrode, a base electrode, and a collector electrode to which the first current is applied; and
a voltage measurer connected to the BJT and a second data I/O pad on the semiconductor substrate, the second I/O pad being connected to the semiconductor memory device, the voltage measurer to generate a test result signal based on a voltage between the collector electrode and the emitter electrode of the BJT, and to output the test result signal through the second data I/O pad when the first current is applied to the collector electrode of the BJT,
wherein:
the voltage between the collector electrode and the emitter electrode of the BJT changes according to a cumulative X-ray dosage to the semiconductor memory device, and
the BJT includes N-type and P-type semiconductor regions formed in the semiconductor substrate.

18. The X-ray detector as claimed in claim 17, wherein the voltage between the collector electrode and the emitter electrode of the BJT increases as the cumulative X-ray dosage increases.

* * * * *